US006833718B1

(12) United States Patent
Bethke et al.

(10) Patent No.: US 6,833,718 B1
(45) Date of Patent: Dec. 21, 2004

(54) PHOTON BEACON

(75) Inventors: David Bethke, Austin, TX (US);
Michael R. Bruce, Austin, TX (US);
Shawn M. McBride, Austin, TX (US);
Greg Dabney, Austin, TX (US); Glen Gilfeather, Del Valle, TX (US); Rama Goruganthu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 96 days.

(21) Appl. No.: 10/324,328

(22) Filed: Dec. 20, 2002

(51) Int. Cl.[7] ............................................. G01R 31/302
(52) U.S. Cl. ................................ 324/752; 324/158.1
(58) Field of Search ................................ 324/752, 750, 324/751, 753, 769, 767, 765, 158.1; 250/214 R, 208.1, 211 J; 356/237.1

(56) References Cited

U.S. PATENT DOCUMENTS

| 4,270,046 A | * | 5/1981 | Werking ..................... 250/205 |
| 4,761,607 A | | 8/1988 | Shiragasawa et al. ....... 324/752 |
| 5,412,328 A | * | 5/1995 | Male et al. .................. 324/752 |
| 5,940,545 A | | 8/1999 | Kash et al. .................. 382/312 |
| 6,596,980 B2 | * | 7/2003 | Rusu et al. ............... 250/214.4 |
| 6,657,446 B1 | * | 12/2003 | Goruganthu et al. ........ 324/752 |

OTHER PUBLICATIONS

M. Lanzoi et al.; *Extended Hot–Carrier Induced Photon Emission In n–Channel MOSFETS*; IEEE; 1990; pp. 69–72.
M. Ghioni et al.; *All–Silicon Avalanche Photodiode Sensitive at 1.3 μm with Picosecond Time Resolution*; IEEE Journal of Quantum Electronics, vol. 28, No. 12; Dec. 1992; pp. 2678–2681.
Andrea L. lacaita et al.; *On the Bremsstrahlung Origin of Hot–Carrier–Induced Photons in Silicon Devices*; IEEE Transactions on Electon Devices, vol. 40, No. 3; Mar. 1993; pp. 577–582.
Andrea Lacaita et al.; *Single–Photon Avalanche Diode with Ultrafast Pulse Response Free from Slow Tails*; IEEE Electron Device Letters, vol. 14, No. 7; Jul. 1993; pp. 360–362.
Luca Selmi et al.; *A Comparative Study Of Hot–Carrier Induced Light Emission and Degradation In Bulk And SOI MOSFETs*; IEEE; 1995; pp. 49–52.
J. C. Tsdng et al.; *Picosecond hot electron light emission from submicron complementary–metal–oxide–semiconductor circuits*; Applied Physics Letters, vol. 70, Issue 7; Feb. 17, 1997; pp. 889–891.
J.A. Kash et al.; *Dynamic Internal Testing of CMOS Circuits Using Hot Luminescence*; IEEE Electron Device Letters. vol. 18, No. 7; Jul. 1997; pp. 330–332.
Alessandro Spinelli et al.; *Avalanche Detector with Ultraclean Response for Time–Resolved Photon Counting*; IEEE Journal of Quantum Electronics, vol. 34, No. 5; May 1998; pp. 817–821.

(List continued on next page.)

Primary Examiner—Michael Tokar
Assistant Examiner—Tung X. Nguyen
(74) Attorney, Agent, or Firm—Timothy M. Honeycutt

(57) ABSTRACT

Various apparatus and methods for enhancing hot-electron luminescence in an integrated circuit are provided. In one aspect, an apparatus is provided that includes a first circuit device coupled to a first voltage source that is operable to bias the first circuit device to a first voltage, and a second circuit device that has a first input coupled to the first voltage source and a junction defining a first side and a second side. One of the first and second sides is coupled to a second voltage source that is independent of the first voltage source and capable of selectively biasing the one of the first and second sides at a second voltage higher than the first voltage. The second device is operable to emit a hot-electron induced photon upon entry into saturation.

16 Claims, 5 Drawing Sheets

OTHER PUBLICATIONS

K.S. Il'in et al.; *Ultimate quantum efficiency of a superconducting hot-electron photodetector*; Applied Physics Letters, vol. 73, No. 26; December 28, 1998; pp. 3938–3940.

J.A. Kash et al.; *Backside Optical Emission Diagnostics for Excess $1_{DDQ}$*; IEEE Journal of Solid–State Circuits, vol. 33, No. 3; Mar. 1998; pp. 508–511.

Dan Knebel et al.; *Diagnosis and Characterization of Timing–Related Defects By Time–Dependent Light Emission*; IEEE, 1998; pp. 733–739.

P.N. Sanda et al.; *Picosecond Imaging Circuit Analysis of the POWER3 Clock Distribution*; IEEE International Solid–State Circuits Conference, Feb. 1999; pp. 372–373.

F. Stellari et al., *Tools for Non–Invasive Optical Characterization of CMOS Circuits*; IEEE; 1999; pp. 487–490.

K.S. Il'in et al.; *Picosecond hot–electron energy relaxation in NbN superconducting photodetectors*; Applied Physics Letters, vol. 76, No. 19; May 8, 2000; pp. 2752–2754.

Franco Zappa et al.; *High–Sensitivity Photodetectors with On–Chip Pinhole for Laser Scanning Microscopy*; IEEE Transactions on Electron Devices, vol. 47, No. 7; Jul. 2000; pp. 1472–1476.

J.C. Tsang et al.; *Picosecond Imaging circuit analysis*; IBM J. Res Develop., vol. 44, No. 4; Jul. 4, 2000; pp. 583–603.

Franco Zappa et al.; *An Integrated Active–Quenching Circuit for Single–Photon Avalanche Diodes*; IEEE Transactions on Instrumentation and Measurement, vol. 49, No. 6; Dec. 2000; pp. 1167–1175.

L. Duraffourg et al.; *Photon Counting in the 1540–nm, Wavelength Region with a Germanium Avalanche Photodiode*; IEEE Journal of Quantum Electronics, vol. 37, No. 1; Jan. 2001; pp. 75–79.

G. Gol'tsman. *Fabrication and Properties of an Ultrafast NbN Hot–electron Single Photon Detector*; IEEE Transactions on Applied Superconductivity, vol. 11, No. 1; Mar. 2001; pp. 574–577.

A.D. Seminov et al.; *Hot–Electron Effect in Superconductors and Its Applications for Radiation Sensors*–University of Rochester Laboratory for Laser Energetics Review, vol. 87; Jun. 2001; pp. 134–152.

Peter Weiss; *Little lamp may set quantum tech aglow*; http://www.phschool.com/science/science_news/articles/little_lamp_quantum.html; Dec. 15, 2001; pp. 1–2.

Eric Smalley; *LED fires one photon at a time*; Technology Research News;http://www.trnmag.com/Stories/2001/121901/LED_fires_one_photon_at_a_Time_121901.html; Dec. 15, 2001; pp. 1–3.

Massimo Ghioni et al.; *monolithic Dual–Detector for Photon–Correlation Spectroscopy With Wide Dynamic Range and 70–ps Resolution*; IEEE Journal of Quantum Electronics, vol. 37, No. 12; Dec. 2001; pp. 1558–1593.

Franco Stellari et al.; *High–Speed CMOS Circuit Testing by 50 ps Time–Resolved Luminescence Measurements*; IEEE Transactions on Electron Devices, vol. 48, No. 12; Dec. 2001; pp. 2830–2835.

Zhitiang Yuan et al.; *Electrically Driven Single–Photon Source*; www.sciencemag.org; Dec. 13, 2001; pp. 102–105.

Daniel S. Burgess; *Quantum Dots Offer Single Photons*; Photonics Technology News; www.photonics.com: Apr. 2002; pp. 1–2.

Semiconductorfabtech.com; *Semiconductorfabtech.com*; http://www.semiconductorfabtech.com/features/tap/industry.news/2001/06/20.02.shtml; Nov. 6, 2002; pp. all.

Mike Bruce et al.; *Single Point PICA Probing with an Avalanche Photo–Diode*; 27th ISTFA;Nov. 2001; pp. 23–29.

* cited by examiner

US 6,833,718 B1

PHOTON BEACON

BACKGROUND OF THE INVENTION

1. Field of the Invention

This invention relates generally to semiconductor processing, and more particularly to devices for generating hot-electron photon emission to methods of using the same.

2. Description of the Related Art

Fault-isolation techniques are critical to the development and manufacture of large scale integrated circuits such as microprocessors. As the numbers of devices per integrated to circuit have continued to climb and the sizes of those devices continued to shrink, methods have been developed to probe the operation of integrated circuits at the device level.

Electron beam micro probing has been used for a number of years as a means of analyzing electrical wave forms generated by the various microscopic circuit structures in an integrated circuit. An electron beam ("e-beam") micro probe is a particularized type of electron microscope that is designed to provide a visual image of the circuit structures on an integrated circuit. E-beams are specifically focused at targeted circuit structures on the integrated circuit and the reaction of the circuit structures to the directed e-beams are sensed by the microscope. Actual electrical test patterns can be used to stimulate the integrated circuit in various ways during the scanning. This is normally accomplished by mounting an integrated circuit on a test board. As with other types of electron microscopy, high vacuum conditions are required for e-beam micro probing.

One method proposed for providing improved imaging over conventional electron beam probing has been coined Picosecond Imaging Circuit Analysis or PICA for short PICA measures time-dependent hot carrier induced light emission from the integrated circuit (IC) both spatially and temporally, thus enabling failure analysis and timing evaluation of a device. Hot electron light emission is generated as a short duration pulse coincident with the normal logic state switching of MOS circuits. This emission can be readily observed and used to directly measure the propagation of high-speed signals through the individual gates. The technique is useful in that non-invasive diagnostics of fully functional MOS devices may be performed.

In one conventional PICA approach, an imaging microchannel plate photo-multiplier tube (MCP-PMT) is used to detect to the photons. Within the field of view of the objective, the technique allows for parallel acquisition of time resolved emission from many nodes at once. Unfortunately, a typical conventional MCP-PMT detector has low quantum efficiency, especially in the near infrared region. In particular, the detector loses virtually all sensitivity for wavelengths above 900 nm. For acquisition of photon emission from the backside of silicon substrates, this has proved problematic. As a result of the spectral characteristics of hot carrier emission and the optical transmission characteristics of doped silicon, most backside transmitted photons will be in the 900 to 1,500 nm range. Thus, the typical MCP-PMT will detect few of the available photons. This can lead to lengthy acquisition times.

Conventional PICA techniques generally provide rather slow acquisition times. There appear to be three primary parameters that dictate acquisition time for PICA; (1) tester loop time; (2) device operating voltage ("$V_{DD}$"); and (3) the relative scarcity of PICA photon events. Limitations as to tester loop time are largely functions of data acquisition and computing speed. Device $V_{DD}$ appears to directly affect the frequency of photon events. Manufacturing experience has shown that photon output decreases with decreasing device $V_{DD}$. The relative scarcity of PICA photon events in general is a function of the somewhat unpredictable quantum mechanical effects of hot electron photon emission in MOS devices.

The present invention is directed to overcoming or reducing the effects of on or more of the foregoing disadvantages.

SUMMARY OF THE INVENTION

In accordance with one aspect of the present invention, an apparatus is provided that includes a first circuit device coupled to a first voltage source that is operable to bias the first circuit device to a first voltage, and a second circuit device that has a first input coupled to the first voltage source and a junction defining a first side and a second side. One of the first and second sides is coupled to a second voltage source independent of the first voltage source that is capable of selectively biasing the one of the first and second sides at a second voltage higher than the first voltage. The second device is operable to emit a photon when activated upon application of a bias from the second voltage source.

In accordance with another aspect of the present invention, an apparatus is provided that includes a first circuit device coupled to a first voltage source that is operable to bias the first circuit device to a first voltage. A second circuit device is provided that has a first input coupled to the first voltage source and a junction defining a first side and a second side. One of the first and second sides is coupled to the first voltage source. A voltage step-up device is coupled between the first voltage source and the one of the first and second sides of the junction. The voltage step-up device is operable to selectively bias the one of the first and second sides at a second voltage higher than the first voltage. The second circuit device is operable to emit a photon when activated upon application of a bias from the second voltage source.

In accordance with another aspect of the present invention, an apparatus is provided that includes a CMOS circuit that has an n-channel transistor coupled to a p-channel transistor. The n-channel transistor and the p-channel transistor are coupled to a first voltage source. A transistor is provided that has a first source/drain coupled to an output of the CMOS circuit, a second source/drain coupled to the first voltage source, and a gate coupled to the first voltage source. A diode is coupled between the first voltage source and the gate to enable the transistor to remain in saturation while an output of the CMOS circuit is in a logic high state, such that the transistor is operable to emit hot-electron induced photons while the output of the CMOS circuit is in the logic high state.

In accordance with another aspect of the present invention, a method of examining a circuit device is provided that includes causing a first circuit device with an operating voltage to switch from a first logic state to a second logic state in response to a control signal. The first circuit has a switching speed. A second circuit device is caused to conduct current in response to the control signal. The the current flow is maintained through the second circuit second circuit device for longer than the switching speed. Photons emitted from the second circuit device are observed.

In accordance with another aspect of the present invention, an apparatus is provided that includes a plurality of circuit devices that have respective outputs. A multiplexer coupled to the respective outputs that is operable to provide a multiplexed output. A second circuit device is provided that has a first input coupled to the multiplexed output, and a junction defining a first side and a second side. One of the first and second sides is coupled to a second voltage source capable of selectively biasing the one of the first and second sides at a second voltage higher than the first voltage. The second device is operable to emit a photon when activated upon application of a bias from the second voltage source.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
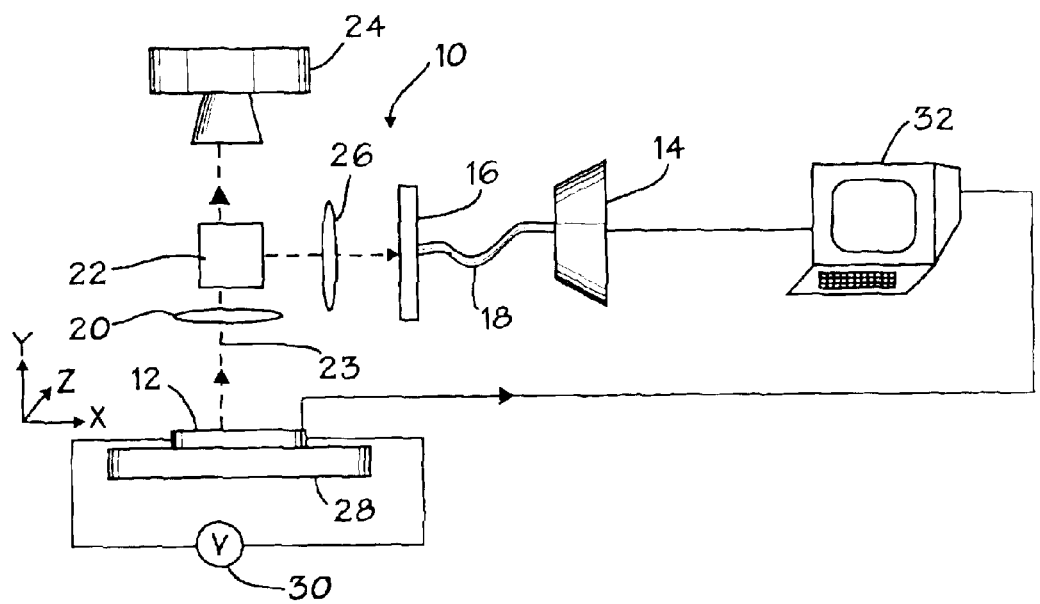
FIG. 1 is a schematic view of an exemplary embodiment of an imaging system that may be used to perform hot electron luminescence imaging of a workpiece in accordance with the present invention.

In the drawings described below, reference numerals are generally repeated where identical elements appear in more than one figure. Turning now to the drawings, and in particular to FIG. 1, therein is shown a schematic view of an exemplary embodiment of an imaging system 10 that may be used to perform hot electron luminescence imaging of a workpiece 12. The workpiece 12 may be a semiconductor wafer, a semiconductor-on-insulator wafer or virtually any other type of substrate useful for circuit fabrication.

The system 10 utilizes a photon detector 14 that is linked to an aperture 16 by a fiber optic cable 18. The detector is advantageously a fast silicon-based avalanche photo diode ("APD"). Optionally, other types of photo detectors may be used. The detector 14 may be built into a commercially available Single Photon Counting Module (SPCM). The SPCM may include a Peltier temperature controller, an active quench circuit, a discriminator and a high voltage supply. The dark count rate of the detector 14 is less than 100 counts per second.

The aperture 16 is placed in a back imaging plane of an objective lens 20. A beam splitter 22 sends a portion, for example 10%, of the light 23 emitted by the workpiece 12 to a navigation camera 24, while the remaining portion, for example 90%, is focused on the aperture 16 by a tube tense 26.

The system 10 may be used in single or multi-point PICA techniques. In the single point PICA approach, an individual transistor is selected using the aperture. The aperture serves to "mask off" light from unwanted portions of the workpiece 12 and transmit light from the desired portion(s). For example, in single point PICA, the aperture 16 serves to "mask off" light from unwanted transistors and transmit light from a desired transistor. IN multi-point PICA, a larger area is targeted by the aperture 16. The size and shape of the aperture 16 can be varied to match different device and/or area devices.

Alignment of the aperture 16 and a particular spot on the workpiece 12 can be accomplished by first disconnecting the cable 18 from the detector 14 and then sending light through the cable 18 from the detector and focusing the light spot on the targeted area of the workpiece 12. The projected image of the aperture will be clearly visible in the navigation camera image 24.

The aperture spot position remains fixed with reference to the image. The workpiece 12 is mounted on an x-y-z stage 28 and may be physically moved to place the desired portion of the workpiece 12 under the aperture viewing location. The field of view (FOV) of the image, and hence the viewing area of the aperture 16, can also be adjusted using different magnification lenses.

A power supply 30 is provided to power the workpiece 12 during PICA imaging. A Controller 32 is provided to transmit signals to and from the workpiece 12 and handle data acquisition. The controller 32 may be a computer or other programmable device capable of controlling parts or all of the system 10.

Figure 2:
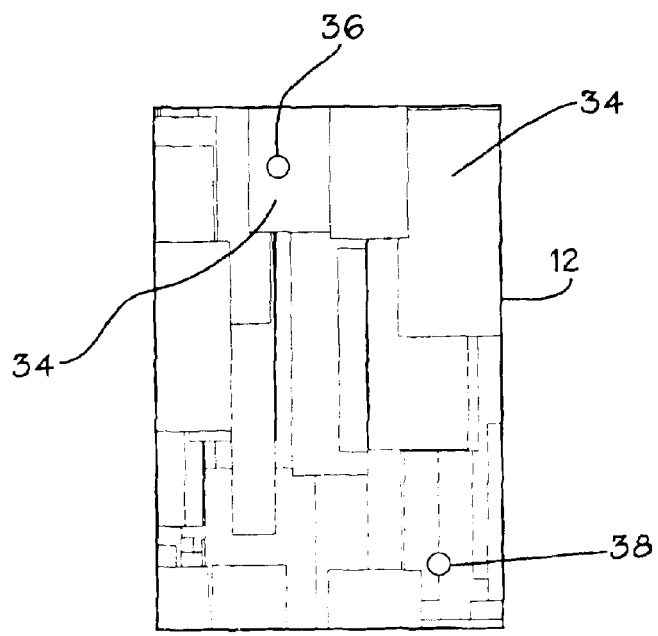
FIG. 2 is a plan view of an exemplary embodiment of semiconductor workpiece that may be imaged in the system of FIG. 1 in accordance with the present invention.

FIG. 2 is a plan view of an exemplary embodiment of the semiconductor workpiece 12 in accordance with the present invention. The workpiece 12 maybe a semiconductor wafer, a semiconductor-on-insulator wafer or virtually any other type of substrate useful for circuit fabrication and may include a myriad of circuit structures generally illustrated by the various rectangles 34. The circuit structures 34 may be virtually any type of device or groups of devices implemented on integrated circuits. Two areas of the workpiece 12 are circumscribed by small circles and designated respectively 36 and 38. The areas 36 and 38 of the workpiece 12 are shown at much higher magnification in the respective views in FIGS. 3 and 4.

Figure 3:
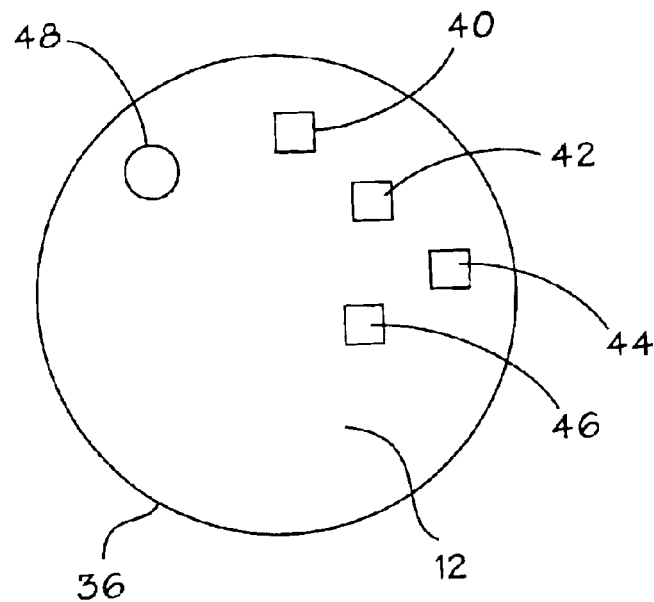
FIG. 3 is a magnified view of a selected portion of the workpiece of FIG. 2.
Figure 4:
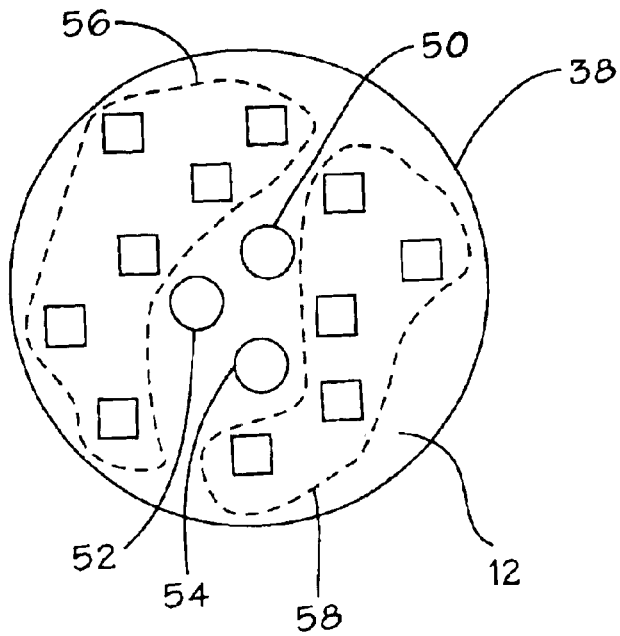
FIG. 4 is a magnified view of another selected portion of the workpiece of FIG. 2.

Attention is now directed to FIGS. 3 and 4. Four exemplary circuit devices 40, 42, 44 and 46 are shown in FIG. 3 along with a photon beacon 48. The devices 40, 42, 44 and 46 may be any of a myriad of different types of circuit devices used in integrated circuit fabrication, such as, for example, transistors, capacitors, diodes, inverters, nodes, macro cells, memory cells, or buses to name just a few. However, an advantageous use of the photon beacon 48 will be in conjunction with complementary MOS ("CMOS") circuits. Such circuits normally include an n-channel transistor coupled to a p-channel transistor. Under static conditions, a CMOS circuit draws almost no current and there is little or no observable hot-electron photon emission. However, when a CMOS gate switches states, a transient current does flow, and both the n-channel and p-channel transistors are briefly in saturation. These transient currents consist of a portion that is needed to charge or discharge downstream gate capacitances, as well as a parasitic portion that flows from $V_{DD}$ (device voltage) to ground as the conductances of the n-channel and p-channel transistors are modulated. The duration of the switching transient for typical n-channel and p-channel transistors may be on the order of a few hundred picoseconds or less, depending on the device geometry.

The photon beacon 48 may be purposely fabricated in close proximity to the circuit devices 40, 42, 44 and 46 as shown in FIG. 3. The purpose of the photon beacon 48 is, as its name implies, to act as a deliberately established source of hot electron luminescence that is in proximity to the circuit devices 40, 42, 44 and 46. The beacon 48 is designed to provide an increased number of emitted photons in response to the same control signals that operate the circuit devices 40, 42, 44 and 46. The emission of the beacon 48 is time and space correlated so the photon emission of the beacon 48 may be used to characterize the switching behavior and thus the waveforms of the circuit devices 40, 42, 44 and 46. With higher photon output, the acquisition time for PICA imaging is decreased.

Referring now to FIG. 4, the circumscribed area 38 of the workpiece 12 shows three photon beacons 50, 52 and 54 clustered between two groups 56 and 58 of circuit devices. The implementation of FIG. 4 illustrates that the photon beacons 50, 52 and 54 maybe essentially located in a cluster or one or more beacons may be located proximate circuit devices of interest as is shown in FIG. 3. Indeed, the skilled artisan will recognize that the spacial orientation of the beacons 48, 50, 52 and 54 may take on a myriad of configurations.

The number and clustering, if any, of the beacons 48, 50, 52, and 54 are largely matters of design discretion. Signal routing to the beacons maybe enhanced if the beacons 48, 50, 52, and 54 are grouped in multiples of eight, e.g., eight, sixteen, thirty-two, sixty-four etc. However, the skilled artisan will appreciate that the beacons 48, 50, 52, and 54 need not be located proximate the circuit devices 40, 42, 44 and 46 or clusters 56 and 58 thereof under study so long as any propagation delays associated with physical separation between the beacons 48, 50, 52, and 54 and the circuit devices 40, 42, 44 and 46 or clusters 56 and 58 thereof are accounted for in calibration.

Figure 5:
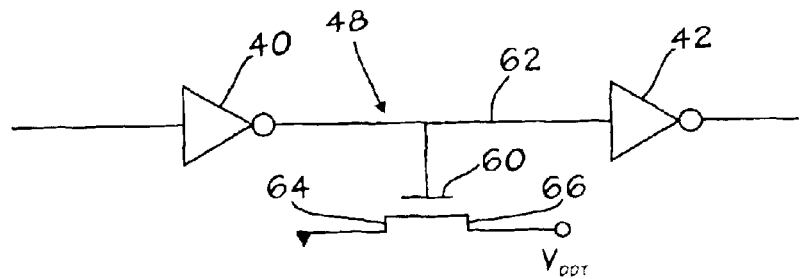
FIG. 5 is a schematic view of an exemplary embodiment of a photon beacon implemented on the workpiece in accordance with the present invention.

An exemplary embodiment of the photon beacon 48 depicted in FIG. 3 may be understood by referring now to FIG. 5, which is a schematic view. Two of the circuit devices 40 and 42 are depicted. In this illustrative embodiment, the photon beacon 48 consists of an NMOS transistor with a control gate 60 tied to a line 62 that couples the devices 40 and 42 to other portions of the workpiece 12. The source 64 of the transistor is grounded and the drain 66 is attached to a voltage supply line labeled $V_{DDT}$. The circuit devices 40 and 42 are implemented as inverters. Under normal device operation, that is, not during PICA testing, the line 62 will be at normal device voltage, which will depend on a particular device involved. $V_{DDT}$ will be at ground. During PICA testing, $V_{DDT}$ will be raised to a voltage level, preferably above $V_{DD}$. The $V_{DDT}$ line is advantageously interfaced to external power separately from the line 62. This may be accomplished by making $V_{DDT}$ pin out separately. One benefit of this independent voltage supply for $V_{DDT}$ is that a higher voltage may be applied to the junction (in this case the pn or np junction of the transistor) of the beacon 48 for the purpose of generating more frequent photon emission during cycling then would be possible at the lower voltage $V_{DD}$. Another benefit of separately supplying $V_{DDT}$ is that the PICA beacon 48 may be held in saturation and thus emit photons during the whole logic high level of the signal propagating through the line 62. A numerical example will illustrate the benefit. Assume for example that the switching time of the invertor 42 is about 5.0 ps. If the drain 66 were tied to the line 62 and thus at $V_{DD}$, the photon beacon 48 might only emit photons during the 5.0 ps switching time of the inverter 42. However, since $V_{DDT}$ is not dependent upon the voltage $V_{DD}$, the photon beacon 48 may emit photons during the whole logic high cycle of about 250.0 ps.

Figure 6:
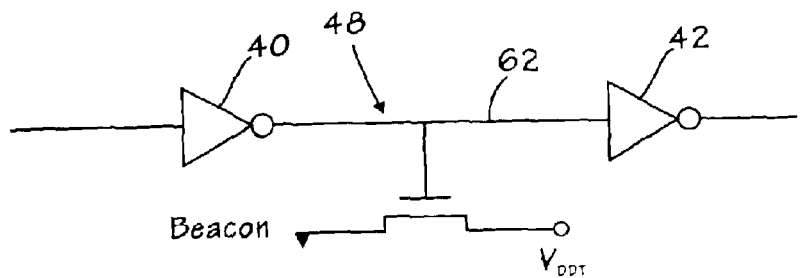
FIG. 6 is a timing diagram for the photon beacon of FIG. 5 in accordance with the present invention.
Figure 6:
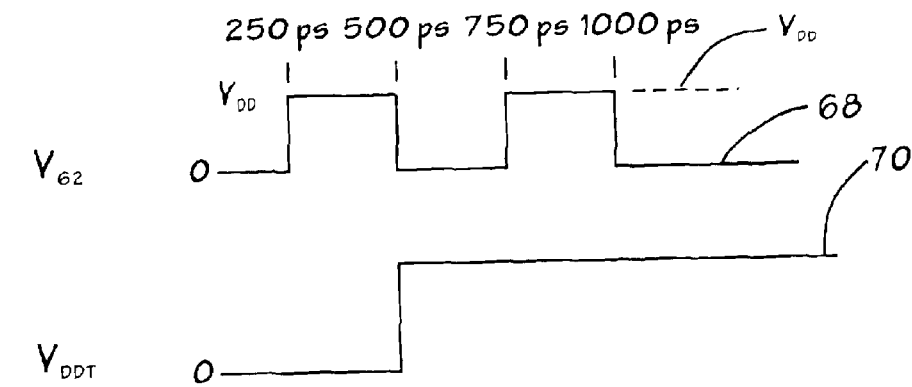
Figure 6:
Figure 6:

A timing diagram is shown in FIG. 6 and illustrates the operation of the photon beacon 48 assuming a 2.0 GHz clock speed. The photon beacon 48 along with the inverters 40 and 42 are superimposed over the top of the timing diagram. The plot 68 shows the voltage $V_{62}$ on the line 62 as a function of time, the plot 70 shows $V_{DDT}$ as a function of time, the plot 72 shows the anticipated photon emission at the inverter 42 without the photon beacon 48 and the plot 74 shows the anticipated photon emission with the beacon 48 in place. As noted above, the logic high cycle lasts for 250.0 ps. At a time t=0, $V_{62}$ is zero, $V_{DDT}$ is zero and the photon emission is zero. At time t=250.0 ps, $V_{62}$ swings high to $V_{DD}$. At t=500.0 Ps, $V_{62}$ swings low and $V_{DDT}$ swings high to some level, preferably greater than $V_{DD}$. $V_{DDT}$ is held high for at least the next 750.0 ps during which time $V_{62}$ swings high and stays high for 250.0 ps and then swings low again at 1,000.0 ps. The plot 74 shows that the anticipated photon emission with the beacon 48 in place and the drain thereof biased to $V_{DDT}$ will produce a relatively high photon emission during the entire 750.0 to 1,000.0 ps high cycle of the inverter 42. Note how this increased photon emission contrasts with the lower incidence of photon emission of the invertor 42 anticipated to occur without the beacon 48 in place as represented by the plot 72.

Figure 7:
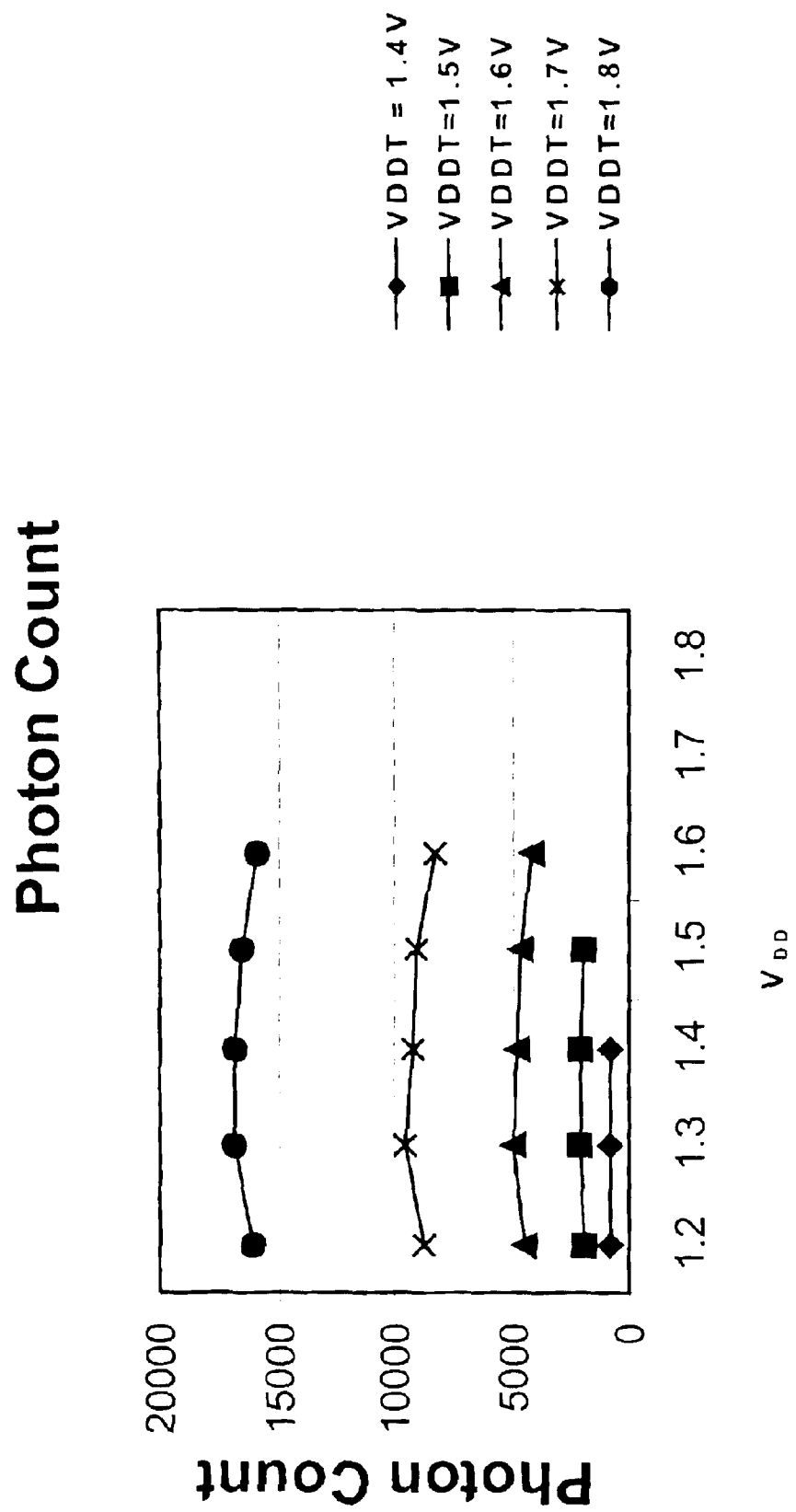
FIG. 7 depicts two charts showing a relationship between various voltage values and photon count for the photon beacon in accordance with the present invention.

Experiments were performed to explore the effects $V_{DDT}$ and $V_{DD}$ on photon count. An inverter arrangement like that shown in FIG. 5, but on a silicon-on-insulator substrate, was subjected to various combinations of $V_{DD}$ (voltage on line 62 in FIG. 5) and $V_{DDT}$ inputs and emitted photons were detected using an APD detector. The results of the tests are summarized in the chart in FIG. 7. As FIG. 7 shows, a $V_{DDT}$ of 1.4V for a $V_{DD}$ of 1.4V generated a little less than 1,000 photons during the recording period. However, a $V_{DDT}$ of 1.4V for a $V_{DD}$ of 1.4V generated around 16,000 to 17,000 photons—a more than tenfold increase.

Another experiment was performed to examine the improvement in photon generation as a function of time for a CMOS circuit including an NMOS inverter with and without a photon beacon. Again, an arrangement like FIG. 5 was used on an SOI substrate. In the first phase of the test, the inverter 42 was supplied with a 100.0 MHZ input signal at a loop time of 100.0 ns. The input voltage $V_{DD}$ was set at 1.4V and the $V_{DDT}$ was set to ground to deactivate the photon beacon 48. The total number of photons collected over a 5.0 minute period was recorded. The test was then repeated under the same conditions, but with $V_{DDT}$ set to 1.8V to activate the photon beacon 48. The data is summarized in the table below.

| CIRCUIT CONFIGURATION | $V_{DD}$ | $V_{DDT}$ | TIME | PHOTON COUNT |
|---|---|---|---|---|
| Inverter without photon beacon | 1.4 V | ground | 300 seconds | 19,456 |
| Inverter with photon beacon | 1.4 V | 1.8 V | 300 seconds | 10,000,000.00 |

The presence of the photon beacon 48 improved photon production by over 50,000%.

In the foregoing illustrative embodiment, the beacon 48 is depicted as an NMOS transistor. However, the benefits of the present invention may be realized by configuring the beacon in a variety of ways. For example, the photon beacon properties may be realized simply by providing a junction that is forward biased. For example, the beacon may consist of an NMOS transistor, a PMOS transistor, a zener diode, an NMOS transistor coupled to a diode, or a diode with a series resistor, to name just a few.

Figure 8:
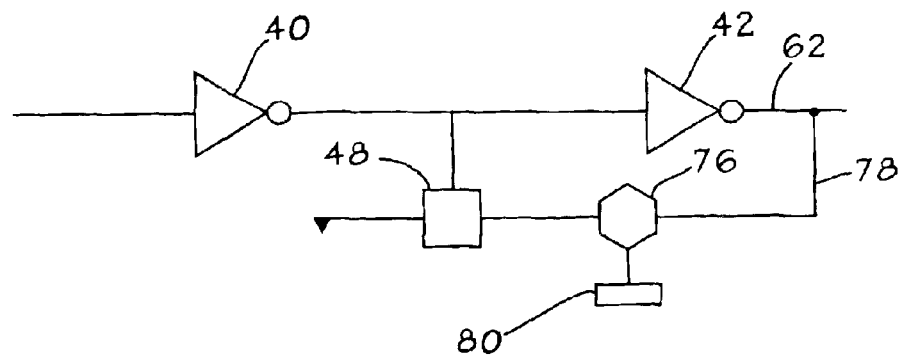
FIG. 8 is a schematic view of another exemplary embodiment of a photon beacon implemented on the workpiece but incorporating a voltage step-up device in accordance with the present invention.

In the embodiment illustrated in FIG. 5, $V_{DDT}$ is provided as a conductor that interfaces with external power separately from the main device power. In this way, $V_{DDT}$ may be set independently from the device voltage or $V_{DD}$. However, in an alternate implementation illustrated in FIG. 8, $V_{DDT}$ may be supplied via a voltage step-up device 76 that couples a line 78 to the beacon 48. The voltage on the line 78 will typically vary from zero to $V_{DD}$. However, the step-up device 76 provides a technique for on-chip stepping up of the voltage supply to the beacon 48. Thus, the device 76 can step the voltage up to something greater than $V_{DD}$ to provide enhanced photon emission. Well-known charge pumps or other step up devices may be used to implement the step up device 76. The operation of the step up device 76 is controlled by control logic 80 which maybe implemented elsewhere on the workpiece.

Figure 9:
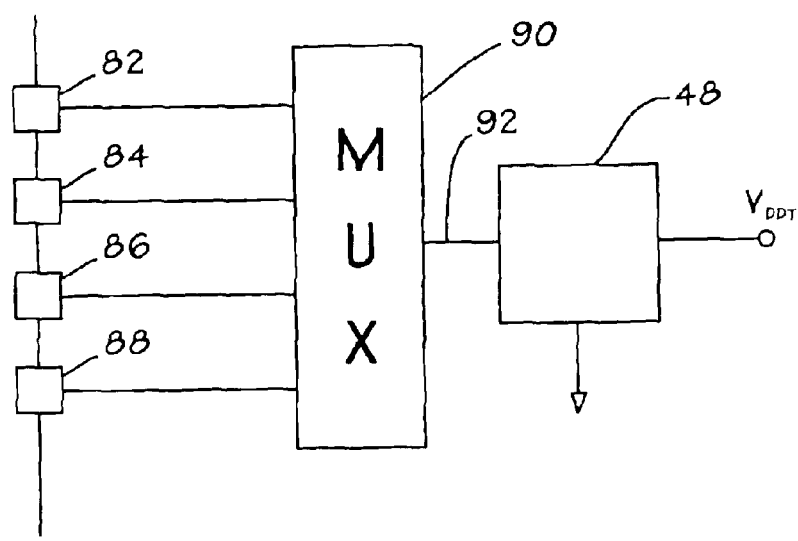
FIG. 9 is a schematic view of another exemplary embodiment of a photon beacon implemented on the workpiece but incorporating a multiplexer to couple the photon beacon to numerous circuit devices in accordance with the present invention.

Another alternate exemplary embodiment is illustrated in FIG. 9. In this illustrative embodiment, the beacon 48 receives a multiplexed input from several circuit devices, four which are shown and designated 82, 84, 86 and 88. Like the devices 40, 42, 44 and 46 described elsewhere herein, the devices 82, 84, 86 and 88 may be transistors, capacitors, diodes, inverters, nodes, macro cells, memory cells, or buses to name just a few. A multiplexer 90 receives the inputs from the devices 82, 84, 86 and 88 and delivers a multiplexed input 92 to the photon beacon 48. The multiplexer 90 may be programmed to multiplex any combination of the signals from the devices 82, 84, 86 and 88 in any order.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
   a first circuit device coupled to a first voltage source operable to bias the first circuit device to a first voltage;
   a second circuit device having a first input coupled to the first voltage source, a junction defining a first side and a second side, one of the first and second sides being coupled to a second voltage source independent of the first voltage source capable of selectively biasing the one of the first and second sides at a second voltage higher than the first voltage; and
   the second device being operable to emit a photon when activated upon application of a bias from the second voltage source.

2. The apparatus of claim 1, wherein the first circuit device comprises an n-channel transistor coupled to a p-channel transistor.

3. The apparatus of claim 1, wherein the second circuit device comprises a transistor.

4. The apparatus of claim 3, wherein the transistor comprises an n-channel transistor.

5. The apparatus of claim 1, wherein the first circuit device and the second circuit device are positioned on a substrate, the second voltage source being external to the substrate.

6. The apparatus of claim 1, wherein the first circuit device is operable to periodically switch between a logic high state and a logic low state, the second circuit device being operable to remain in saturation while the first circuit device is in a logic high state.

7. An apparatus, comprising:
   a CMOS circuit having an n-channel transistor coupled to a p-channel transistor, the n-channel transistor and the p-channel transistor being coupled to a first voltage source;
   a transistor having a first source/drain coupled to an output of the CMOS circuit, a second source/drain coupled to the first voltage source, and a gate coupled to the first voltage source;
   a diode coupled between the first voltage source and the gate to enable the transistor to remain in saturation while an output of the CMOS circuit is in a logic high state; and
   whereby the transistor is operable to emit hot-electron induced photons while the output of the CMOS circuit is in the logic high state.

8. The apparatus of claim 7, wherein the CMOS circuit comprises an inverter.

9. The apparatus of claim 7, wherein the transistor comprises an n-channel transistor.

10. A method of examining a circuit device, comprising:
    causing a first circuit device with an operating voltage to switch from a first logic state to a second logic state in response to a control signal, the first circuit having a switching speed;
    causing a second circuit device to conduct current in response to the control signal;
    maintaining the current flow through the second circuit device for longer than the switching speed; and
    observing photons emitted from the second circuit device.

11. The method of claim 10, comprising time correlating the emission of the photons to the switching of the first circuit device from a first logic state to a second logic state.

12. The method of claim 10, comprising biasing an input of the second circuit device to a voltage higher than the operating voltage of the first circuit device.

13. The method of claim 12, wherein the biasing of the input of the second circuit device comprises coupling the input to an external voltage source.

14. The method of claim 10, wherein the causing a second circuit device to conduct current in response to the control signal comprises causing a transistor to go into saturation.

15. The method of claim 14, wherein the transistor comprises an n-channel transistor.

16. The method of claim 14, wherein the causing a first circuit device with an operating voltage to switch from a first logic state to a second logic state in response to a control signal comprises causing an output of a CMOS circuit to switch from a first logic state to a second logic state.

* * * * *